(12) United States Patent
Yano (10) Patent No.: US 6,337,280 B1
(45) Date of Patent: Jan. 8, 2002

(54) POLISHING CLOTH AND METHOD OF MANUFACTURING SEMICONDUCTOR DEVICE USING THE SAME

(75) Inventor: Hiroyuki Yano, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/306,758

(22) Filed: May 7, 1999

(30) Foreign Application Priority Data

May 11, 1998 (JP) .......................................... 10-127441

(51) Int. Cl.$^7$ ..................... H01L 21/302; H01L 21/461; B24D 11/00
(52) U.S. Cl. ..................... 438/693; 438/692; 451/534
(58) Field of Search ................................ 438/586, 693, 438/692; 451/534

(56) References Cited

U.S. PATENT DOCUMENTS

| | | | | |
|---|---|---|---|---|
| 5,876,266 A | * | 3/1999 | Miller et al. | 451/36 |
| 5,914,275 A | * | 6/1999 | Kodera et al. | 438/693 |
| 5,938,801 A | * | 8/1999 | Robinson | 51/306 |
| 5,976,000 A | * | 11/1999 | Hudson | 451/534 |
| 6,015,754 A | * | 1/2000 | Mase et al. | 438/692 |
| 6,186,870 B1 | * | 2/2001 | Wright et al. | 451/41 |

* cited by examiner

Primary Examiner—Richard Elms
Assistant Examiner—Adam Pyonin
(74) Attorney, Agent, or Firm—Finnegan, Henderson, Farabow, Garrett & Dunner, L.L.P.

(57) ABSTRACT

A polishing cloth used for a chemical mechanical polishing comprises a base body holding a slurry on the surface and serving to mechanically polish the surface of a target object to be polished. Fine particles soluble in a solvent are dispersed in the base body.

14 Claims, 6 Drawing Sheets

-- IC-1000
— FILLER PAD

SLURRY
$Al_2O_3$ : 3 wt %
$(NH_4)_2S_2O_8$ : 1 wt %
BENZOTRIAZOLE : 0.02 %

-- IC-1000
— FILLER PAD
SLURRY
$Al_2O_3$ : 3wt %
$Fe(NO_3)_3$ : 5wt %

POLISHING CLOTH AND METHOD OF MANUFACTURING SEMICONDUCTOR DEVICE USING THE SAME

BACKGROUND OF THE INVENTION

The present invention relates to a polishing cloth used in a chemical mechanical polishing (CMP).

Recently, a CMP method for flattening a surface of an insulating layer or a wiring layer has attracted attention in this technical field.

A known polishing cloth used in the CMP method includes "Politex," (trade name of a polishing cloth manufactured by Rodel Inc.) which does not require a pad conditioning treatment (dressing). Politex has a cross sectional shape resembling an arrangement of octopus traps and, thus, is excellent in its capability of retaining a slurry used for polishing, where said slurry contains water, $SiO_2$, $Al_2O_3$, and chemicals (oxidizing agent), etc. Also, Politex has a very flexible surface and, thus, does not impart sharp scratches to the surface of the polished material.

However, Politex has a very low compression modulus of elasticity, which is less than 10 MPa, and, thus, is very soft. Therefore, when Politex is used in a flattening process of a target object to be flattened, the polishing rate is very low and the flatness of the target object after the polishing treatment is not satisfactory.

The known polishing cloths also include "IC-1000" (trade name of a polishing cloth manufactured by Rodel Inc.). Voids are formed within IC-1000. Also IC-1000 has a compression modulus of elasticity of about 200 MPa and, thus, is considerably harder than Politex.

In general, a pad conditioning treatment using a diamond conditioning plate is applied to the polishing cloth IC-1000 for polishing a semiconductor wafer. In the pad conditioning treatment, the surface layer of the polishing cloth IC-1000 is scratched to form a soft surface layer. If the pad conditioning treatment is not applied to IC-1000, IC-1000 has a hard surface layer, leading to a low capability of retaining a slurry and, thus, to a markedly low polishing rate. Naturally, the life of the polishing cloth IC-1000 is determined by the number of pad conditioning treatments applied thereto because the surface layer of the polishing cloth IC-1000 is scratched every time the pad conditioning treatment is applied to the polishing cloth IC-1000.

Where the polishing cloth IC-1000 subjected to a pad conditioning treatment that is used for polishing 1000 wafers, the surface layer of IC-1 000 is lost in a thickness of about 850 µm. Where the pad conditioning treatment is applied to the polishing cloth IC-1000 under milder conditions for ensuring a longer life of IC-1000, the polishing rate is lowered or rendered unstable.

It should be noted that a soft layer having a compression modulus of elasticity of 10 MPa or less is formed in a thickness of scores of microns in the surface region of the polishing cloth IC-1000 immediately after the pad conditioning treatment. The particular soft layer impairs the flatness on the polished surface of the target object.

Further, the soft layer is compressed during the polishing treatment so as to be hardened with the progress of the polishing treatment. Since the surface region is hardened, the scratches generated on the surface region of the polishing cloth IC-1000 are enlarged with progress of the polishing treatment, though the scratch occurrence on the soft surface region is suppressed immediately after initiation of the polishing treatment.

As described above, a soft surface layer is formed in the polishing cloth represented by Politex, with the result that the polishing rate is low and the polished target object is not satisfactory in the surface flatness, though scratches are not formed on the target object.

On the other hand, the polishing cloth represented by IC-1000 is defective in that, if a pad conditioning treatment is not applied to the polishing cloth, many scratches are formed on the target object with progress of the polishing treatment. If a pad conditioning treatment is applied to the polishing cloth, however, the surface region of the polishing cloth is scratched off. Naturally, the polishing cloth is thinned, leading to a short life of the polishing cloth.

Further, if a semiconductor wafer is polished by using the conventional polishing cloth for forming, for example, a buried wiring (damascene wiring), dishing or thinning is brought about by an over-polishing so as to generate the so-called "dishing". The dishing causes a short-circuiting of the wiring formed in an upper layer in the lithography process. Also, the wiring formed on the dished or thinned surface is rendered longer, leading to an increased resistance of the wiring.

BRIEF SUMMARY OF THE INVENTION

An object of the present invention is to provide a polishing cloth that permits flattening the surface of a target object at a high accuracy, permits achieving a stable polishing rate, and permits suppressing the scratch occurrence in the target object, and a method of manufacturing a semiconductor device using the particular polishing cloth.

According to an aspect of the present invention, which is intended to achieve the above-noted object, a polishing cloth is provided comprising a base body holding a slurry on the surface and serving to mechanically polish a surface of a target object to be polished, and fine particles dispersed in the base body and soluble in a solvent.

According to another aspect of the present invention, a polishing cloth is provided, comprising fine particles soluble in a solvent, and a base body having the fine particles dispersed therein and holding a slurry on the surface, the fine particles being dissolved in the solvent when a surface of a target object is mechanically polished by the polishing cloth so as to form concavities on the surface of the polishing cloth.

According to another aspect of the present invention, a method of manufacturing a semiconductor device is provided by using a polishing cloth, comprising the steps of forming an insulating film on a substrate, followed by forming a wiring groove on the substrate through the insulating film, forming a metal wiring layer on the substrate and in the wiring groove, burying the metal wiring in the wiring groove, and mechanically polishing the metal wiring buried in the wiring groove with a polishing cloth so as to remove an undesired portion of the metal wiring and, thus, to flatten the surface of the metal wiring, the polishing cloth comprising a base body holding a slurry on the surface and serving to mechanically polish a surface of a target object to be polished, and fine particles dispersed in the base body and soluble in a solvent.

Further, according to still another aspect of the present invention, a method of manufacturing a semiconductor device is provided by using a polishing cloth, comprising the steps of forming a groove in a substrate, forming an insulating film on the substrate such that the insulating film is buried in the groove, and polishing the insulating film by using a polishing cloth so as to remove an undesired portion of the insulating film, thus, to flatten the surface of the insulating film, the polishing cloth comprising a base body holding a slurry on the surface and serving to mechanically polish a surface of a target object to be polished, and fine particles dispersed in the base body and soluble in a solvent.

In the polishing cloth of the present invention, fine particles soluble in a solvent are dispersed in a base body serving to mechanically polish a target object. During the polishing operation, the fine particles exposed to the surface of the base body are dissolved in a solvent such as water to form concavities holding a slurry on the surface of the base body. It follows that the polishing cloth of the present invention permits flattening the surface of the target object highly accurately at a high polishing rate. In addition, the scratch formation can be suppressed on the surface of the polished target object.

In the method of the present invention for manufacturing a semiconductor device by using the particular polishing cloth, a wiring groove is formed in a substrate, followed by burying a metal wiring in the wiring groove. Then, the undesired portion of the metal wiring is removed by polishing with the polishing cloth having fine particles soluble in a solvent dispersed in a base body, thereby improving the quality of the wiring, particularly, a damascene wiring.

Further, the method of the present invention for manufacturing a semiconductor device by using the particular polishing cloth can also be applied to the case where an oxide film is buried in place of the metal wiring in the wiring groove. In this case, the oxide film is polished by the polishing cloth to flatten the surface of the oxide film satisfactorily.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will now be described with reference to the accompanying drawings.

Before describing the embodiment of the present invention, the construction of a polishing cloth that is ideal in performance will be described with reference to FIG. 1.

Figure 1:
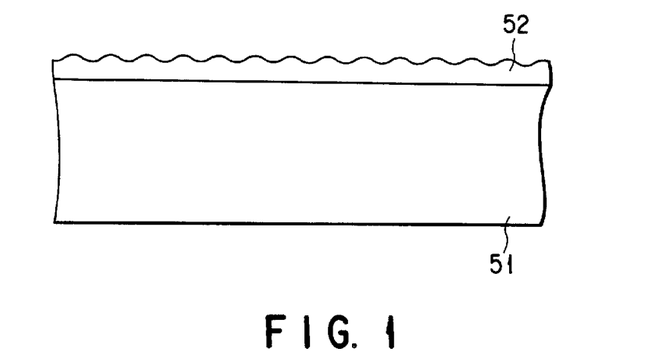
FIG. 1 schematically shows the construction of an ideal polishing cloth.

A polishing cloth shown in FIG. 1 is considered to meet various requirements such as a stable polishing rate, high flatness in a polished surface of a target object, capability of suppressing scratch occurrence, and a long life.

As shown in the drawing, the polishing cloth comprises an inner layer 51 and a surface layer 52. For ensuring a good flatness in the polished surface of a target object, the inner layer 51 should desirably be hard. Also, the surface layer 52 should desirably be soft for suppressing the scratch occurrence and should desirably be very thin for preventing the flatness of the polished surface from being impaired. Further, the surface layer 52 should desirably have an appropriately large surface area for allowing the surface layer 52 to hold a slurry.

A polishing cloth of the present invention meets all the requirements noted above. Specifically, since fine particles are dispersed in a base body in the polishing cloth of the present invention, the inner region of the polishing cloth is hard. It should be noted in this connection that voids are formed in the conventional polishing cloth IC-1000 as described previously, leading to a hardness lower than that of the polishing cloth of the present invention.

In the polishing cloth of the present invention, fine particles exposed to the surface are dissolved in a solvent, e.g., water, with the result that fine concavities are formed on the surface of the polishing cloth, leading to a large surface area. Of course, a slurry can be held satisfactorily on the surface of the polishing cloth. What should also be noted is that the irregular surface resulting from formation of fine concavities makes the surface region softer than the inner region. Since the polishing cloth of the present invention has a soft surface, the scratch occurrence can be suppressed.

In another embodiment of the present invention, fine particles coated with a material insoluble in water or slurry are dispersed in the base body. In this case, even if a plurality of fine particles dispersed in the base body are in mutual contact, all the fine particles in contact with each other are not dissolved in the solvent such as water. If all the fine particles in contact with each other are dissolved in a solvent, large concavities are formed in the polishing cloth so as to soften even the inner layer of the polishing cloth. In the present invention, however, the surface coating permits only the fine particles exposed to the surface to be dissolved in the solvent. Since all the fine particles in contact with each other are not dissolved in the solvent, large concavities are not formed in the polishing cloth of the present invention.

Where the solvent is water or slurry, the fine particles newly exposed to the surface during the polishing operation are dissolved in the solvent, with the result that deterioration of the polishing performance is suppressed during the polishing operation.

A high polishing rate can be obtained where the fine particles have a diameter of 5 to 30 μm. Some embodiments of the present invention will now be described in detail with reference to FIG. 2, et seq.

[First Embodiment]

Figure 2:
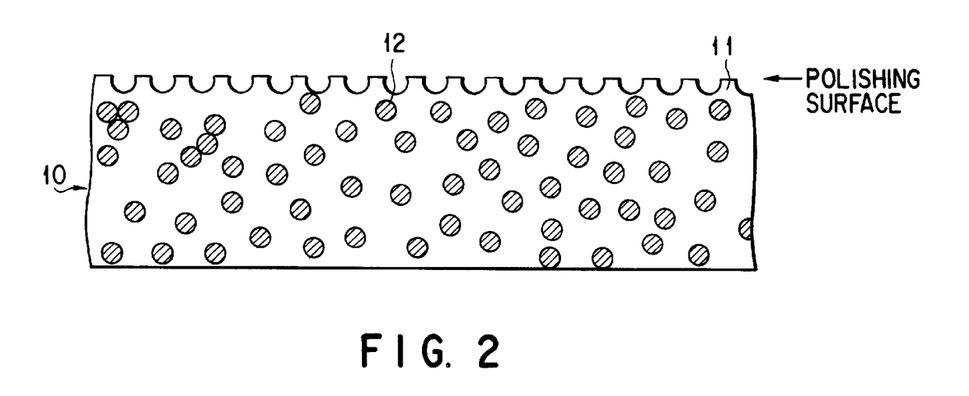
FIG. 2 is a partial cross sectional view showing the construction of a polishing cloth according to a first embodiment of the present invention.

FIG. 2 is a cross sectional view showing the construction of a polishing cloth 10 for CMP according to a first embodiment of the present invention. As shown in the drawing, the polishing cloth 10 comprises a base body 11 made of, for example, polystyrene and about 25% by weight of fine particles, e.g., water-soluble fillers 12 made of cellulose, dispersed in the base body 11.

The base body 11 is hard, and the water-soluble filler 12 is a solid and, thus, is unlikely to be compressed. Therefore, the polishing cloth 10 has a compression modulus of elasticity of 10 GPa or more.

Those water-soluble fillers 12 which are exposed to the surface of the polishing cloth 10 are dissolved in water to form fine concavities so as to increase the surface area of the polishing cloth 10. With increase in the surface area, the surface region of the polishing cloth 10 is softened so as to prevent scratches from being formed on the polished surface of the target object. In addition, the slurry can be retained efficiently by the polishing cloth 10.

The density and depth of the concavities formed on the surface of the polishing cloth 10 can be controlled easily by controlling the diameter and the mixing ratio of the water-soluble fillers 12. In other words, the conditions of the surface region such as the thickness and softness can be controlled easily by controlling the diameter and the mixing ratio of the water-soluble fillers 12.

Table 1 shows the polishing rate and the scratch occurrence, covering the case where an aluminum material containing 0.5% of copper was polished by the polishing cloth 10 of the present invention as well as by the conventional polishing cloths of Politex and IC-1000:

TABLE 1

| Polishing cloth | Conditioning | Polishing rate | Scratch occurrence |
|---|---|---|---|
| Politex | none | 230 nm/min | none |
| IC-1000 | none | 60 nm/min | large scratch |
| IC-1000 | scratch | 210 nm/min | small scratch |
| Polishing cloth of present invention | none | 205 nm/min | none |
| Polishing cloth of present invention | scratch | 310 nm/min | none |

In the case of the conventional polishing cloth of IC-1000, the polishing rate was 60 nm/min where the conditioning treatment was not applied thereto, which was markedly lower than the polishing rate of 210 nm/min where the conditioning treatment was applied thereto. It is considered reasonable to understand that, if a conditioning treatment is not applied, the surface layer of the polishing cloth IC-1000 was incapable of sufficiently retaining the slurry, leading to the markedly low polishing rate.

On the other hand, the polishing cloth of the present invention achieved a high polishing rate of 205 nm/min even if the conditioning treatment was not applied thereto. Clearly, the water-soluble fillers exposed to the surface of the polishing cloth were dissolved in water (slurry) to form fine concavities on the surface of the polishing cloth. As a result, the surface area of the polishing cloth was increased and the slurry was retained sufficiently on the surface of the polishing cloth, leading to the high polishing rate.

It should also be noted that the polishing cloth of the present invention was found to be stable in the polishing rate. It should be noted in this connection that the water-soluble fillers 12 are newly exposed to the surface with progress in the abrasion of the surface layer of the base body 11 during the polishing operation. Naturally, the newly exposed fillers 12 are dissolved in the slurry to form new concavities on the surface of the polishing cloth 10, with the result that the polishing rate is kept stable, as pointed out above.

Further, where a conditioning treatment was applied to the polishing cloth 10 of the present invention, the polishing rate was found to be very high, i.e., 310 nm/min, which is markedly higher than the polishing rate in the case where the conditioning treatment was not applied to the polishing cloth 10 of the present invention or the polishing rate achieved by the conventional polishing plates of Politex and IC-1000.

Figure 3:
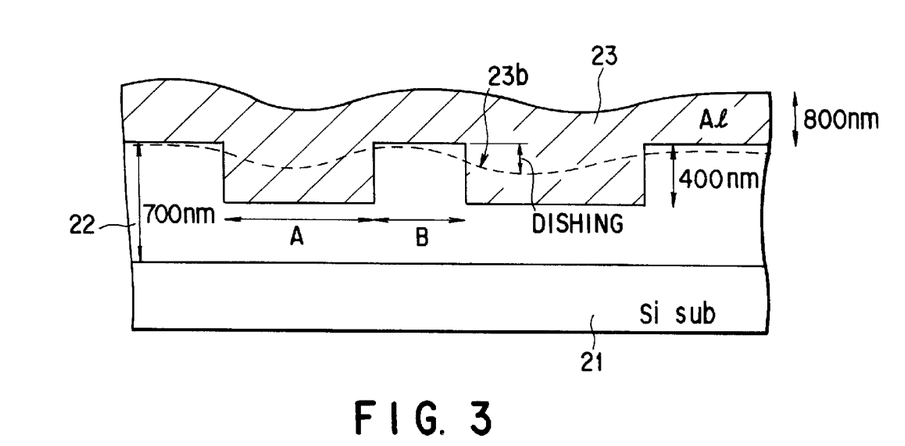
FIG. 3 is a cross sectional view partially showing the construction of a polished object used for evaluation of a polishing cloth.

A dishing amount was evaluated by using a semiconductor structure shown in FIG. 3 as a sample to be polished. As shown in the drawing, the semiconductor structure consisted of a silicon substrate 21, a silicon oxide film 22 formed on the silicon substrate 21 and having recesses, and an aluminum film 23 formed on the entire surface of the silicon oxide film 22. The aluminum film 23 was 800 nm thick, and the silicon oxide film 22 was 700 nm thick. Further, each of the recesses formed in the silicon oxide film 22 was 400 nm deep. A width A of the recess and a distance B between the two adjacent recesses were set to meet the relationship: $A/(A+B)=0.7$. The dishing amount was evaluated for the cases where the width A of the recess was set at 10 μm and 100 μm.

To be more specific, the aluminum film 23 was polished until the polished surface reached a curve 23b so as to evaluate the dishing amount. Table 2 shows the results of the evaluation:

TABLE 2

| Polishing cloth | Conditioning | Width of wiring (A = 10 μm) | Width of wiring (A = 100 μm) |
| --- | --- | --- | --- |
| Politex | none | 160 nm | >350 nm |
| IC-1000 | none | 200 nm | 250 nm |
| IC-1000 | scratch | 80 nm | 210 nm |
| Polishing cloth of present invention | none | 8 nm | 40 nm |
| Polishing cloth of present invention | scratch | 20 nm | 80 nm |

In the case of using the conventional polishing cloth of Politex, which is a very soft polishing cloth, the dishing amount was very large, i.e., 160 nm in the case where the width of the wiring was only 10 μm, and more than 350 nm in the case where the width of the wiring was 100 μm.

In the case of using the conventional polishing cloth of IC-1000 to which a conditioning treatment was applied, the dishing amount was suppressed to 80 nm (A=10 μm) and 210 nm (A=100 μm), which are smaller than those in the case of using Politex. However, these values are markedly larger than those in the case of using the polishing cloth of the present invention. A soft surface layer is formed on the polishing cloth IC-1000 by the conditioning treatment so as to give an adverse effect to the flatness of the polished surface. Therefore, it appears reasonable to understand that the dishing amount is diminished in the case where a conditioning treatment is not applied to IC-1000. However, the dishing amount in the case where a conditioning treatment was not applied to IC-1000 was found to be 200 nm (A=10 μm) and 250 nm (A=100 μm), which are clearly larger than those in the case where the conditioning treatment was applied.

It should be noted in this connection that, if a conditioning treatment is not applied, a deep scratch deeper than 20 nm is formed on the surface of the aluminum film, and the aluminum film is eroded such that the scratch is enlarged, leading to the large dishing amount as pointed out above.

On the other hand, in the case of using the polishing cloth 10 of the present invention to which a conditioning treatment was not applied, the dishing amount was found to be only 8 nm in the case where the width A of the recess was set at 10 μm and to be only 40 nm in the case where the width A of the recess was set at 100 μm. Clearly, the polishing cloth of the present invention permits markedly improving the dishing amount.

To reiterate, the polishing cloth 10 of the present invention comprises the very hard base body 11 having a compression modulus of elasticity of 10 GPa. In addition, the polishing cloth 10 has a soft surface layer. It follows that scratches are not generated on the polished surface of the target object. Also, a slurry is held sufficiently on the soft surface of the polishing cloth. Further, the soft surface layer is controlled to be very thin. These conditions are considered to have diminished the dishing amount in the case of using the polishing cloth of the present invention.

Incidentally, the dishing amount was found to be 20 nm (A=10 μm) and 80 nm (A=100 μm) in the case of using the polishing cloth 10 of the present invention to which a conditioning treatment was applied. The conditioning treatment is considered to have further softened the soft surface layer and/or to have increased the thickness of the soft surface layer so as to increase the dishing amount.

A polishing rate of an aluminum film was evaluated by varying the diameter of the water-soluble filler 12. In each of the test cases, the polishing cloth was prepared by setting the concentration of the water-soluble fillers at 25% by weight. Table 3 shows the results:

TABLE 3

| Filler diameter | Polishing rate (nm/min) |
| --- | --- |
| 1 μm | 42 |
| 5 μm | 205 |
| 10 μm | 220 |
| 30 μm | 140 |
| 50 μm | 95 |
| 100 μm | 80 |

Table 3 clearly shows that the polishing rate is dependent on the diameter of the water-soluble filler 12. Where the filler diameter was set at 1 μm, a large number of scratches were generated on the polished surface of the aluminum film. It should be noted that the concavities formed on the surface of the polishing plate are unduly small when the filler diameter is 1 μm, resulting in failure to form a soft surface layer on the polishing cloth 10. Also, where the concavities formed on the surface are unduly small, the polishing cloth fails to retain the slurry sufficiently. As a result, numerous scratches were generated on the polished surface of the aluminum film.

On the other hand, the polishing rate was low in the case where the filler diameter was set at 50 μm or 100 μm. The low polishing rate is considered to have been caused by the phenomenon that concavities formed on the surface of the polishing cloth were unduly large. The experimental data shown in Table 3 clearly support that the diameter of the water-soluble filler should desirably fall within a range of between about 5 μm and 30 μm.

As described above, the polishing cloth of the present invention comprises a soft surface layer having a large number of concavities formed therein and an inner layer consisting of a base body and a large number of water-soluble fillers dispersed in the base body. The particular construction of the polishing cloth produces prominent effects. To reiterate, the soft surface layer including a large number of concavities permits improving the polishing rate and suppressing the scratch formation. At the same time, the hard inner layer permits improving the flatness of the polished surface of the target object.

What should also be noted is that, even if the surface layer of the base body is abraded during the polishing treatment, other water-soluble fillers are newly exposed to the surface of the polishing cloth so as to be dissolved in water or slurry. It follows that a soft surface layer is kept formed on the polishing cloth, making it possible to obtain a stable polishing rate.

An additional feature of the present invention to be noted is that, since a soft surface layer is formed, it is substantially unnecessary to apply a conditioning treatment to the polishing cloth so as to increase the life of the polishing cloth.

(Second Embodiment)

Figure 4:
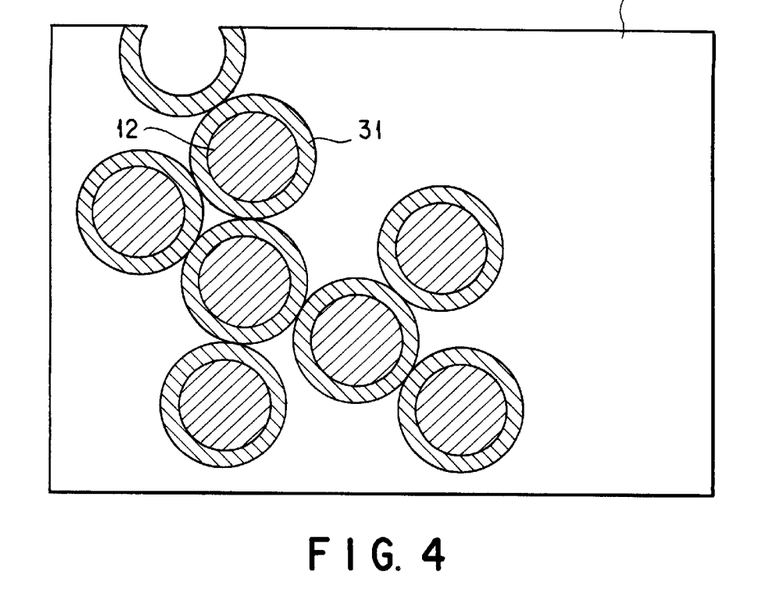
FIG. 4 is a partial cross sectional view showing the construction of a polishing cloth according to a second embodiment of the present invention.

FIG. 4 is a cross sectional view showing the construction of a polishing cloth according to a second embodiment of the present invention. Those members of the polishing cloth shown in FIG. 4 which are equal to those shown in FIG. 2 are denoted by the same reference numerals so as to omit an overlapping description.

Figure 5:
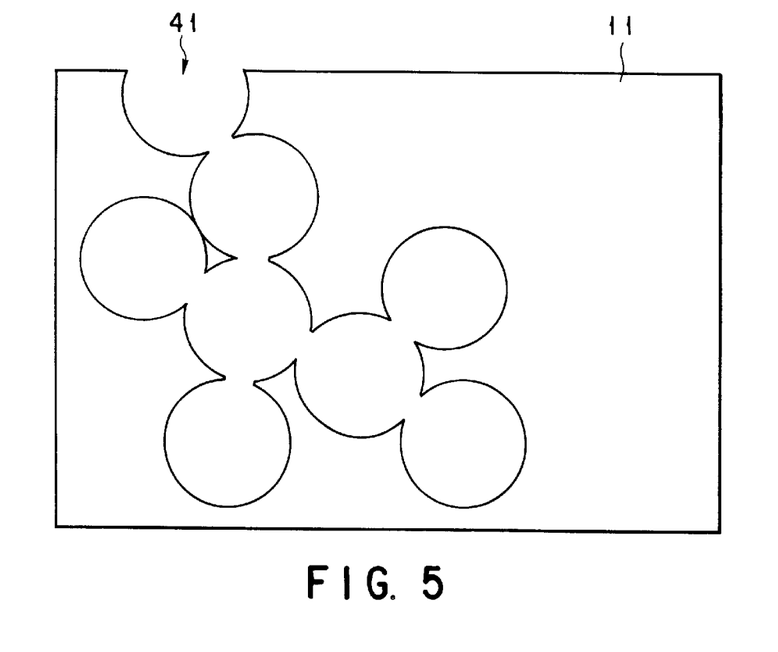
FIG. 5 is a cross sectional view of a polishing cloth for explaining the problem taking place by mutual contact of fine particles within the polishing cloth.

The polishing cloth of the second embodiment is featured in that a coating layer 31 made of a material insoluble in water (slurry) is formed to cover the outer surface of the water-soluble filler 12.

Where a large amount of the water-soluble filler is dispersed in the base body, the filler particles tend to be brought into mutual contact within the base body with a high probability. If the polishing cloth in which filler particles are in mutual contact is brought into contact with water, a large and deep concavity 41 is formed, as shown in FIG. 5.

In the second embodiment of the present invention, however, all the water-soluble fillers 12, which are in mutual contact, are not dissolved in the solvent because of the presence of the coating layer 31. Naturally, the concavity formed on the surface does not extend deep into the base body, making it possible to prevent the compression modulus of elasticity of the polishing cloth from being lowered.

The present invention is not limited to the embodiments described above. For example, in each of the embodiments described above, the base body is formed of polystyrene, and the water-soluble filler is formed of cellulose. However, other materials can also be used for forming these base bodies and the water-soluble fillers.

It is also possible to disperse a liquid material into the base body in place of the solid water-soluble fillers. The liquid material, which is certainly softer than a solid material, is sufficiently hard, compared with a gaseous material, making it possible to use a liquid material in place of the water-soluble filler. Of course, the liquid material exposed to the surface of the base body flows out of the base body so as to form concavities in the regions in which the liquid material was sealed previously. It follows that the liquid material dispersed in the base body produces an effect similar to that produced by the solid water-soluble filler.

In the embodiments described above, the fine particles dispersed in the base body are soluble in water. However, it is also possible to disperse fine particles that are soluble in a solvent other than water in the base body. It suffices to spray a solvent capable of dissolving the fine particles against the surface of the polishing cloth before performing the polishing treatment so as to dissolve the fine particles dispersed in the base body so as to form concavities on the surface of the polishing cloth.

A method of manufacturing a semiconductor device having a damascene wiring structure involving a wiring groove will now be described. The polishing cloth of the present invention described above is employed in the manufacture of the particular semiconductor device.

Figure 6:
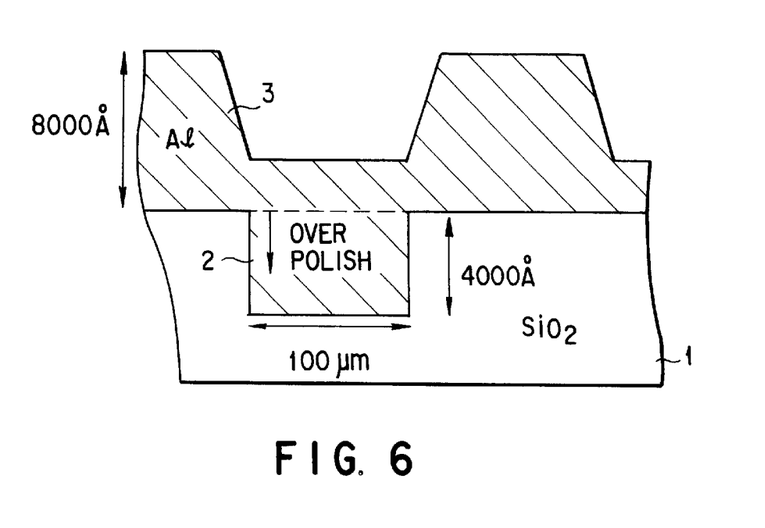
FIG. 6 is a cross sectional view showing a gist portion in the process of manufacturing a semiconductor device, covering the case where the metal wiring in the buried wiring structure (damascene wiring), which is polished by the polishing cloth of the present invention, is made of aluminum.

Specifically, FIG. 6 is a partial cross sectional view showing a damascene wiring structure in which an Al wiring 3 was buried in a wiring groove 2 formed in a $SiO_2$ substrate 1. The wiring groove 2 had a depth of 4,000 Å and a width of 100 μm. Also, the thickness of the Al layer included in the Al wiring 3 was 8,000 Å before the polishing operation.

It should be noted that the Al wiring 3 is buried in the wiring groove 2, and the surface of the Al wiring 3 is polished by the polishing cloth of the present invention. In this case, the Al wiring 3 is over-polished such that the upper surface of the Al wiring 3 is positioned within the wiring groove 2 that is lower than the upper surface of the $SiO_2$ substrate 1 so as to bring about a so-called "dishing" or "thinning". As a result, a dishing is brought about.

In this embodiment, the flatness of the polished surface of the Al wiring 3 was evaluated under a load of 300 g/cm² and the rotating speed of the table and the carrier set at 50 rpm. The scratches formed on the Al wiring 3 buried in the wiring groove 2 were evaluated by KLA, with the result that 42,328 scratches/wafer were observed in the case of using the conventional polishing cloth of IC-1000 in contrast to only 320 scratches/wafer in the case of using the polishing cloth of the present invention.

Figure 7:
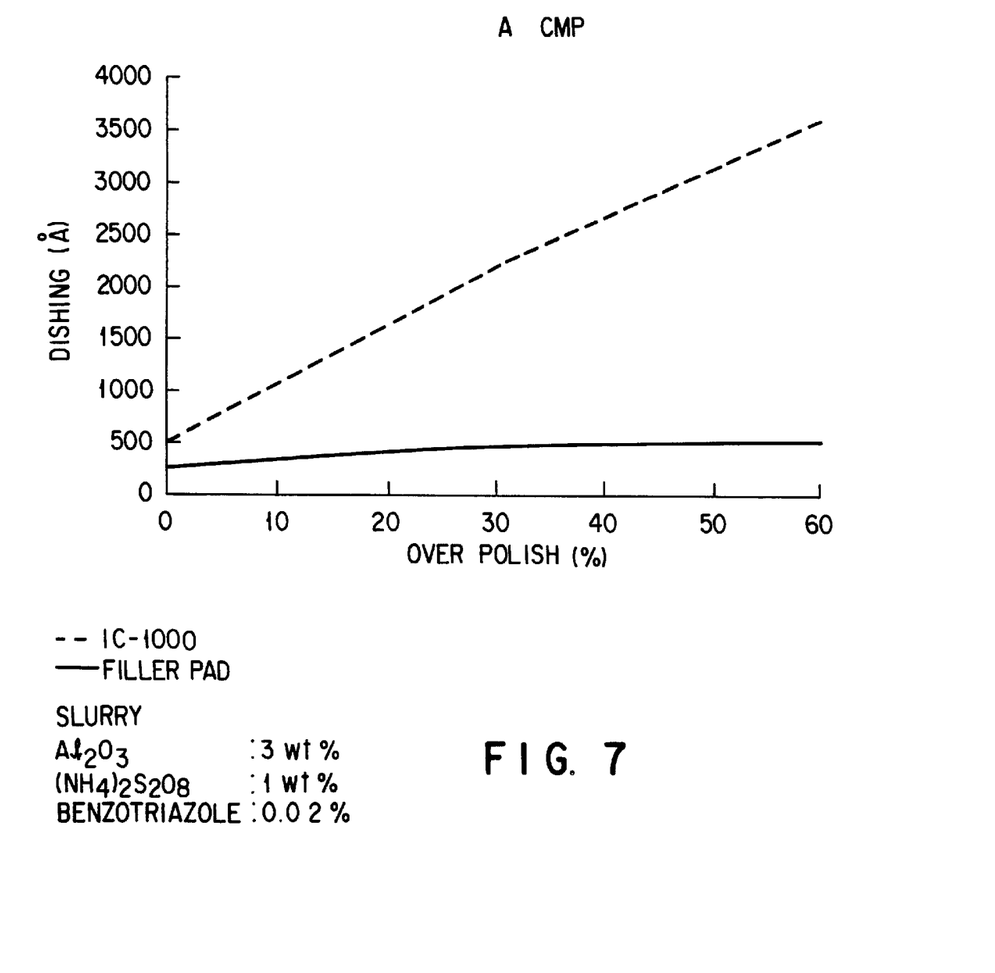
FIG. 7 is a graph showing a dishing occurrence in the case of polishing the metal aluminum wiring shown in FIG. 6 with a polishing cloth of the present invention in comparison with the prior art.

FIG. 7 is a graph showing that the polishing cloth of the present invention is markedly superior to the conventional polishing cloth in the effect of suppressing the dishing occurrence. To be more specific, the number of dishings that took place in the case of polishing the Al wiring 3 with the conventional polishing cloth of IC-1000 exceeded 3,500 dishings (Å) when the over-polishing reached 60% of the depth of the wiring groove 2, as seen from the dotted line shown in FIG. 7.

On the other hand, a slurry prepared by dispersing in water 3% by weight of $Al_2O_3$, 1% by weight of $(NH_4)_2S_2O_8$ and 0.02% of benzotriazole was retained on the surface of the polishing cloth of the present invention having fine particles dispersed in a base body. In the case of polishing the surface of the Al wiring 3 with the polishing cloth of the present invention noted above, the number of dishings occurring on the surface of the polished Al wiring 3 scarcely increased even when the over-polishing reached 60% of the depth of the wiring groove 2 as seen from the solid line shown in FIG. 7. The experimental data clearly support that the quality and the characteristics of the Al wiring 3 were improved by the polishing treatment in the case of using the polishing cloth of the present invention. In other words, the wiring was formed satisfactorily.

Figure 8:
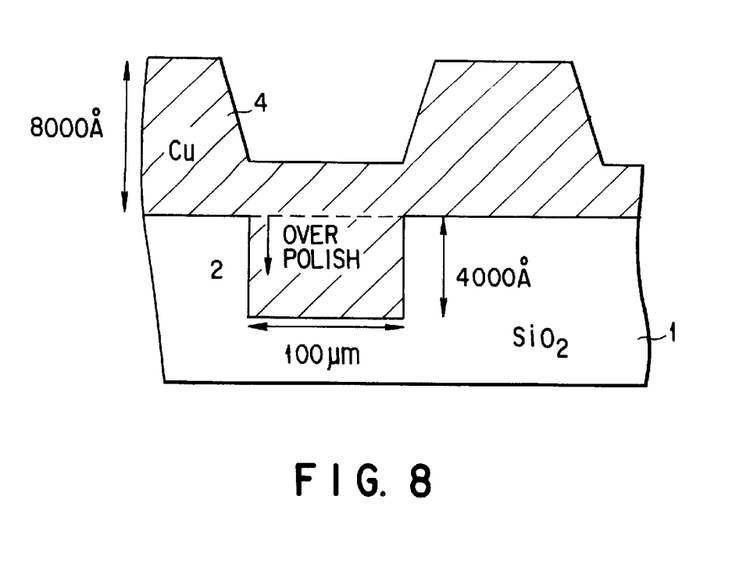
FIG. 8 is a cross sectional view showing a gist portion in the process of manufacturing a semiconductor device, covering the case where the metal wiring in the buried wiring structure (damascene wiring), which is polished by the polishing cloth of the present invention, is made of copper.

FIG. 8 is a partial cross sectional view showing a damascene wiring structure in which an Cu wiring 4 was buried in a wiring groove 2 formed in a $SiO_2$ substrate 1. The wiring groove 2 had a depth of 4,000 Å and a width of 100 μm. Also, the thickness of the Cu layer included in the Cu wiring 4 was 8,000 Å before the polishing operation.

Figure 9:
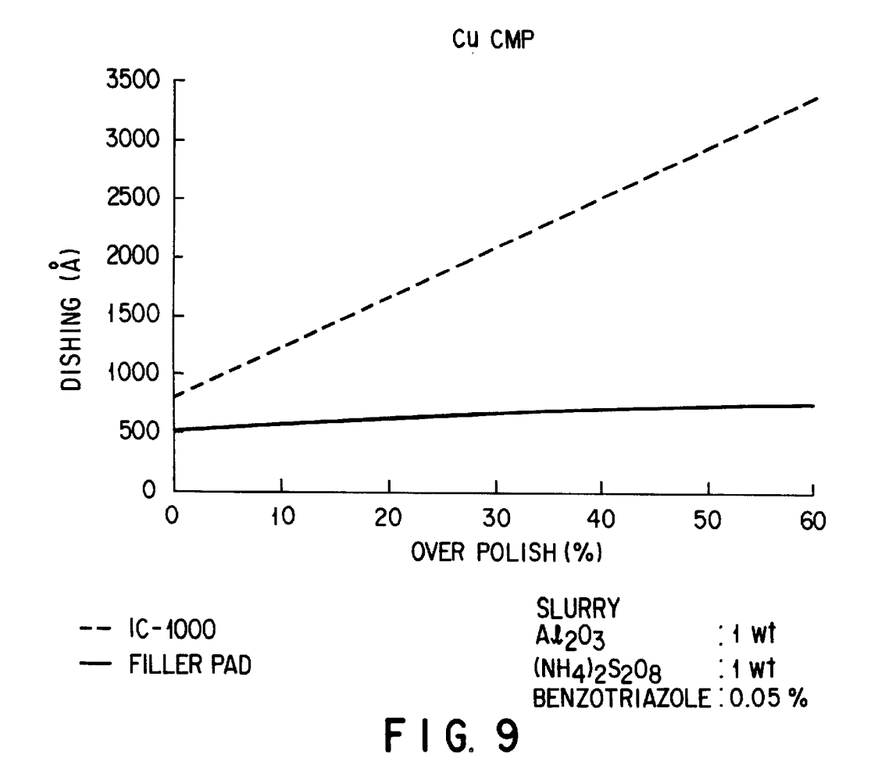
FIG. 9 is a graph showing a dishing occurrence in the case of polishing the metal copper wiring shown in FIG. 8 with a polishing cloth of the present invention in comparison with the prior art.

FIG. 9 is a graph showing that the polishing cloth of the present invention is markedly superior to the conventional polishing cloth in the effect of suppressing the dishing occurrence. To be more specific, the number of dishings that took place in the case of polishing the Cu wiring 4 with the conventional polishing cloth of IC-1000 approached 3,500 dishings (Å) when the over-polishing reached 60% of the depth of the wiring groove 2, as seen from the dotted line shown in FIG. 9.

On the other hand, a slurry prepared by dispersing in water 1% by weight of $Al_2O_3$, 1% by weight of $(NH_4)_2S_2O_8$ and 0.05% of benzotriazole was retained on the surface of the polishing cloth of the present invention having fine particles dispersed in a base body. In the case of polishing the surface of the Cu wiring 4 with the polishing cloth of the present invention noted above, the number of dishings occurring on the surface of the polished Cu wiring 4 increased only slightly even when the over-polishing reached 60% of the depth of the wiring groove 2 as seen from the solid line shown in FIG. 9.

Figure 10:
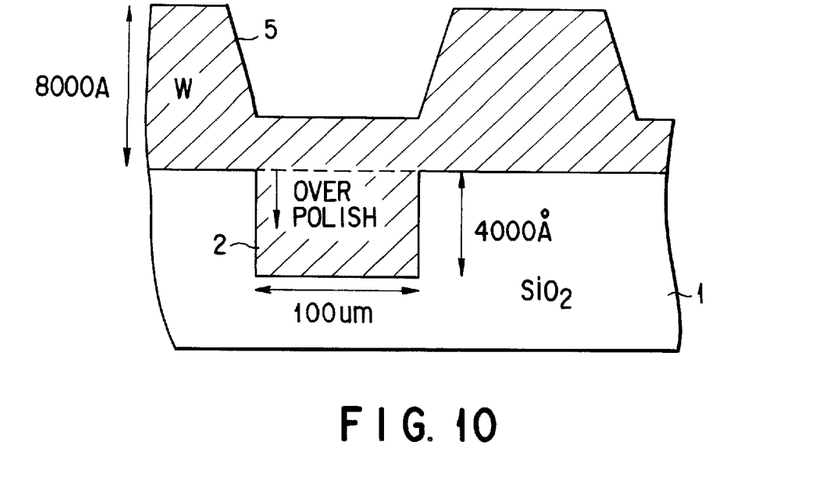
FIG. 10 is a cross sectional view showing a gist portion in the process of manufacturing a semiconductor device, covering the case where the metal wiring in the buried wiring structure (damascene wiring), which is polished by the polishing cloth of the present invention, is made of tungsten.

FIG. 10 is a partial cross sectional view showing a damascene wiring structure in which a W wiring 5 was buried in a wiring groove 2 formed in a $SiO_2$ substrate 1. The wiring groove 2 had a depth of 4,000 Å and a width of 100 μm. Also, the thickness of the W layer included in the W wiring 5 was 8,000 Å before the polishing operation.

Figure 11:
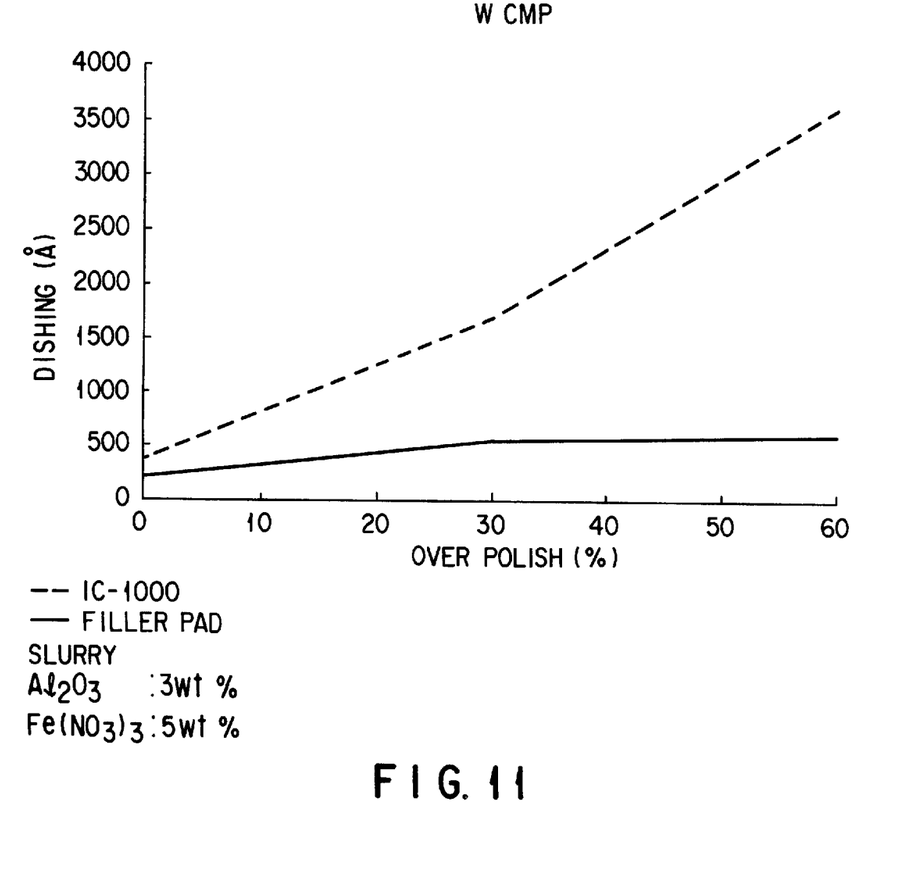
FIG. 11 is a graph showing a dishing occurrence in the case of polishing the metal tungsten wiring shown in FIG. 10 with a polishing cloth of the present invention in comparison with the prior art.

FIG. 11 is a graph showing that the polishing cloth of the present invention is markedly superior to the conventional polishing cloth in the effect of suppressing the dishing occurrence. To be more specific, the number of dishings that took place in the case of polishing the W wiring 5 with the conventional polishing cloth of IC-1000 exceeded 3,500 dishings (Å) when the over-polishing reached 60% of the depth of the wiring groove 2, as seen from the dotted line shown in FIG. 11.

On the other hand, a slurry prepared by dispersing in water 3% by weight of $Al_2O_3$ and 5% by weight of $Fe(NO_3)_3$ was retained on the surface of the polishing cloth of the present invention having fine particles dispersed in a base body. In the case of polishing the surface of the W wiring 5 with the polishing cloth of the present invention noted above, the number of dishings occurring on the surface of the polished W wiring 5 increased only slightly even when the over-polishing reached 60% of the depth of the wiring groove 2 as seen from the solid line shown in FIG. 11.

Figure 12:
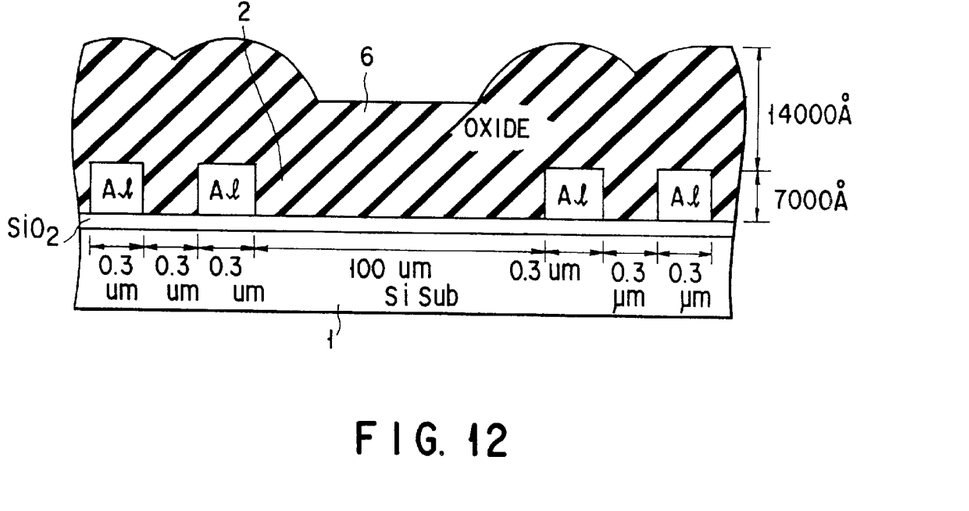
FIG. 12, which is directed to an application of the method of the present invention for manufacturing a semiconductor device, is a cross sectional view showing a gist portion in the process of manufacturing a semiconductor device, covering the case where an oxide film buried in a groove formed in a substrate is polished by using a polishing cloth of the present invention.

An additional experiment was conducted as another embodiment of the present invention. In this experiment, an oxide film 6 having a thickness of 14,000 Å was formed on a Si substrate 1 having a wiring groove 2 formed on the surface in a depth of 7,000 Å and a width of 100 µm, as shown in FIG. 12. The upper surface of the oxide film 6 thus formed was polished with the polishing cloth of the present invention. The slurry used in the polishing step was prepared by diluting SC-1 manufactured by Cabot Inc. with pure water twice as much as SC-1.

Figure 13:
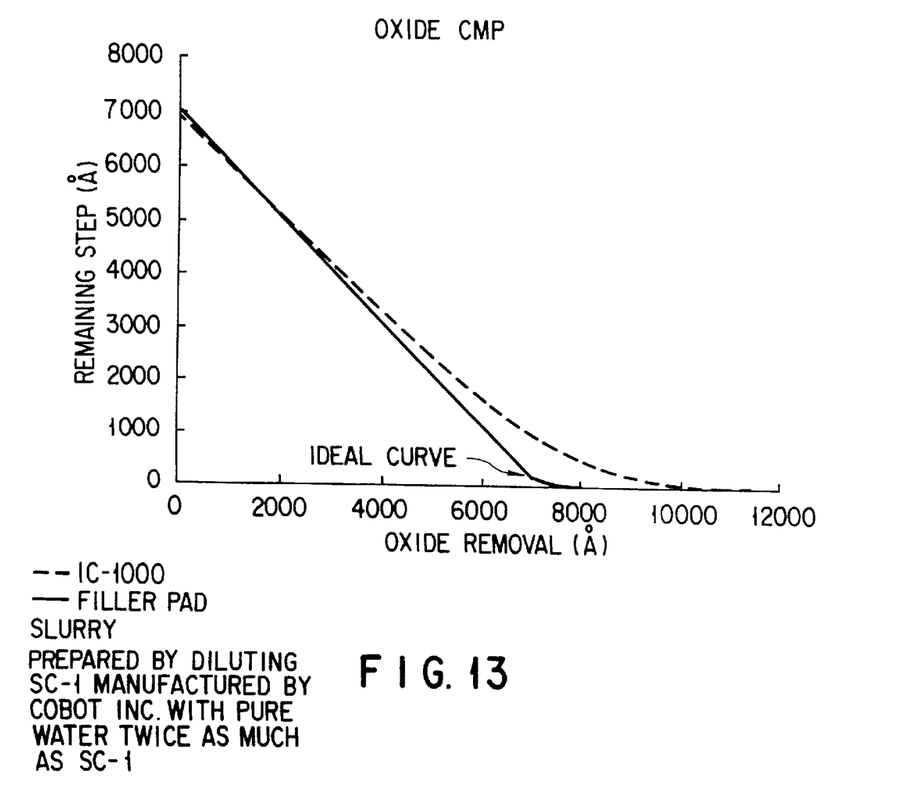
FIG. 13 is a graph showing that the oxide removal at the same remaining step/Å is improved in the case of polishing the oxide film shown in FIG. 11 with a polishing cloth of the present invention, compared with the prior art.

The experimental data are shown in a graph of FIG. 13 in terms of the relationship between the remaining step (Å) and the oxide removal (Å). A dotted line shown in FIG. 13 represent the polishing with the conventional polishing cloth of IC-1000. On the other hand, the solid line in FIG. 13 represents the polishing with the polishing cloth of the present invention. As apparent from FIG. 13, the solid line representing the use of the polishing cloth of the present invention is closer to an ideal curve than the dotted line representing the use of the conventional polishing cloth of IC-1000. It follows that the polishing cloth of the present invention permits flattening the surface of an oxide film more uniformly than the conventional polishing cloth of IC-1000.

The present invention can be worked in variously modified fashions within the technical scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device by using a polishing cloth, comprising:

providing a substrate;

forming an insulating film on said substrate, followed by forming a wiring groove on said substrate through said insulating film;

forming a metal wiring layer on the substrate and in said wiring groove; and polishing mechanically the metal wiring layer formed on the substrate and in said wiring groove with a polishing cloth so as to remove an undesired portion of the metal wiring layer and, thus, to flatten the surface of the metal wiring layer, said polishing cloth comprising a base body holding a slurry on the surface and serving to mechanically polish a surface of a target object to be polished, and fine particles dispersed in said base body and soluble in a solvent, wherein a coating layer insoluble by a solvent in the slurry is formed to cover the outer surfaces of the fine particles.

2. The method of manufacturing a semiconductor device by using a polishing cloth according to claim 1, wherein said metal wiring layer contains Al.

3. The method of manufacturing a semiconductor device by using a polishing cloth according to claim 1, wherein said metal wiring layer contains Cu.

4. The method of manufacturing a semiconductor device by using a polishing cloth according to claim 1, wherein said metal wiring layer contains W.

5. A method of manufacturing a semiconductor device by using a polishing cloth, comprising:

providing a substrate;

forming a groove in said substrate;

forming an insulating film on said substrate such that said insulating film is buried in said groove; and polishing the insulating film by using a polishing cloth so as to remove an undesired portion of the insulating film, thus, to flatten the surface of the insulating film, said polishing cloth comprising a base body holding a slurry on the surface and serving to mechanically polish a surface of a target object to be polished, and fine particles dispersed in said base body and soluble in a solvent, wherein a coating layer insoluble by a solvent in the slurry is formed to cover the outer surfaces of the fine particles.

6. The method of manufacturing a semiconductor device by using a polishing cloth according to claim 5, wherein said insulating film is a $SiO_2$ film.

7. A method of manufacturing a semiconductor device by using a polishing cloth, comprising:

providing a substrate;

forming an insulating film on said substrate, followed by forming a wiring groove on said substrate through said insulating film;

forming a metal wiring layer on the substrate and in said wiring groove; and polishing mechanically the metal wiring layer formed on said substrate and in said wiring groove with a polishing cloth so as to remove an undesired portion of the metal wiring layer and, thus, to flatten the surface of the metal wiring layer, said polishing cloth comprising a base body holding a slurry on the surface and serving to mechanically polish a surface of a target object to be polished and fine particles dispersed in said base body and soluble in a solvent, wherein said fine particles have a particle diameter of 5 µm or more.

8. The method of manufacturing a semiconductor device by using a polishing cloth according to claim 7, wherein said fine particles have a particle diameter of 30 µm or less.

9. The method of manufacturing a semiconductor device by using a polishing cloth according to claim 7, wherein said metal wiring layer contains Al.

10. The method of manufacturing a semiconductor device by using a polishing cloth according to claim 7, wherein said metal wiring layer contains Cu.

11. The method of manufacturing a semiconductor device by using a polishing cloth according to claim 7, wherein said metal wiring layer contains W.

12. A method of manufacturing a semiconductor device by using a polishing cloth, comprising:

providing a substrate;

forming a groove in said substrate; forming an insulating film on said substrate such that said insulating film is buried in said groove; and polishing the insulating film by using a polishing cloth so as to remove an undesired portion of the insulating film, thus, to flatten the surface of the insulating film, said polishing cloth comprising a base body holding a slurry on the surface and serving to mechanically polish a surface of a target object to be polished, and fine particles dispersed in said base body and soluble in a solvent, wherein said fine particles have a particle diameter of 5 $\mu$m or more.

13. The method of manufacturing a semiconductor device by using a polishing cloth according to claim 12, wherein said fine particles have a particle diameter of 30 $\mu$m or less.

14. The method of manufacturing a semiconductor device by using a polishing cloth according to claim 12, wherein said insulating film is a $SiO_2$ film.

* * * * *